United States Patent [19]

Sheng et al.

[11] Patent Number: 4,670,090

[45] Date of Patent: Jun. 2, 1987

[54] METHOD FOR PRODUCING A FIELD EFFECT TRANSISTOR

[75] Inventors: Neng-Haung Sheng; Mau-Chung F. Chang, both of Thousand Oaks; Chien-Ping Lee, Pasadena, all of Calif.

[73] Assignee: Rockwell International Corporation, El Segundo, Calif.

[21] Appl. No.: 821,664

[22] Filed: Jan. 23, 1986

[51] Int. Cl.⁴ .................... B44C 1/22; B29C 37/00; C03C 15/00; C03C 25/06

[52] U.S. Cl. ........................ 156/653; 29/571; 29/576 W; 29/578; 29/591; 156/657; 156/659.1; 156/661.1; 156/668; 357/41; 357/49; 357/65; 430/315; 430/317; 427/88

[58] Field of Search ........... 156/643, 644, 646, 652, 156/653, 656, 657, 659.1, 661.1, 662, 668; 29/571, 576 W, 578, 580, 591; 427/88–90; 430/313, 317, 318, 315, 314; 357/23.1, 23.6, 41, 49, 65

[56] References Cited

U.S. PATENT DOCUMENTS 4,222,164  9/1980  Friebwasser ................. 29/571
4,546,540 10/1985  Ueyanagi et al. ............ 156/643 X
4,572,765  2/1986  Berry ............................ 156/643

FOREIGN PATENT DOCUMENTS 57-30376  2/1982  Japan ........................... 156/644

Primary Examiner—William A. Powell

Attorney, Agent, or Firm—H. Fredrick Hamann; Craig O. Malin; Max Geldin

[57] ABSTRACT

A method is disclosed which is capable of producing improved field effect transistors such as high electron mobility transistors and metal semiconductor field effect transistors. The method comprises a dual level photoresist deposition technique on a semiconductor wafer, in conjunction with a double lift-off and dummy gate procedure. In the process, T-bar shaped portions of overlying top and bottom photoresist layers are produced, one of such T-bar shaped portions forming a dummy gate. Metal is then deposited on the upper surface of the T-bar shaped portions and on the exposed surface of the substrate to form a source and a drain. In a first lift-off step the metal on the T-bar shaped portions and the underlying remaining top layer portions, are removed. An inorganic film such as SiO is then deposited on the remaining bottom layer portions and over the metal on the surface of the substrate. In a second lift-off step the SiO film on the remaining bottom layer portions and the underlying bottom layer portions are removed. The space between remaining portions of the SiO film on the substrate defines a gate opening of submicron size. The metal on the surface of the substrate beneath the inorganic film is then alloyed by treatment at high temperature, and gate metal is deposited over the gate opening. Metal can then be deposited on the SiO imprinted film to form interconnects to the source and drain.

13 Claims, 6 Drawing Figures

METHOD FOR PRODUCING A FIELD EFFECT TRANSISTOR

STATEMENT OF GOVERNMENT INTEREST

The Government has rights in this invention pursuant to Contract No. N00014-83-C-0347 awarded by the Department of the Navy.

BACKGROUND OF THE INVENTION

This invention relates to the field of solid state electronics, and is particularly directed to a double lift-off process for producing a field effect transistor (FET).

As the demand for high device density and smaller features increases in the integrated circuit industry, multi-leval resist systems become more popular and have been successfully used in conjunction with optical projection aligners to print submicron features.

Self-aligned n+ implantation is effective to reduce the source parasitic resistance and consequently to increase the extrinsic transconductance of GaAs FET devices such as HEMTs (high electron mobility transistors) and MESFETs (metal semiconductor field effect transistors). However, this process requires that the Schottky gates be deposited before the implantation and therefore the threshold voltage of the device can not be adjusted. Furthermore, the Schottky gate has to be made from certain material, such as refractory silicide, that can withstand high temperature post implantation annealing.

Consequently, this process is not totally compatible to the commonly used enhancement/depletion (E/D) circuits because separate gate recessings are generally required for the E and D devices. To solve this problem, a substitutional gate process was recently proposed. This technology allows one to monitor the gate recessing and also to use regular metal instead of refractory silicide.

SUMMARY OF THE INVENTION

It is an object of the invention to provide a method for producing a field effect transistor.

Another object of the invention is the provision of a process which self aligns the ohmic contacts of a high electron mobility transistor, and results in HEMTs having good transconductance and also good subthreshold characteristics.

According to the invention, there is provided an improved process for producing a pattern including a dummy gate on a semiconductor wafer. The invention involves, as its main features a dual-level photoresist deposition technique on a semiconductor wafer, in conjunction with a double lift-off and dummy gate procedure, termed herein the "3D" technique, for producing a self-aligned field effect transistor. This, during the process, a T-bar type dummy gate is formed using a dual level photoresist system. The process is particularly designed for the fabrication of improved self-aligned high electron mobility transistors (HEMTs) and metal semiconductor field effect transistors (MESFETs).

The top bar of the T-bar formed of the top layer resist is used to lift off the metal, and the bottom layer resist of the T-bar is used to lift off the dielectric and consequently define the gate.

In the process, two layers of photoresist are spun sequentially on a wafer. By means of a pattern or alignment target, which delineates the dummy gate, the top layer of photoresist is first exposed and developed to remove the exposed portions. The bottom layer of resist is then exposed to deep UV exposure which undercuts the bottom layer portions beneath the edges of the remaining portions of the upper layer. The bottom layer is then developed to remove the exposed portions, forming T-bar shaped remaining unexposed portions of overlying top and bottom resist layers, including the T-bar dummy gate.

Metal is then deposited on the surface of the remaining unexposed upper resist layers of the T-bar shaped portions and also on the exposed surface of the substrate to form a source and a drain. The metal is then lifted off with the top photoresist layers in the first lift-off procedure. An inorganic dielectric film, e.g. $SiO_x$ where x is 1 or 2, is then deposited on the upper surface of the remaining unexposed portions of the bottom resist layer and also covers the metal previously deposited on the substrate surface. A second lift-off procedure is carried out to remove the undercut unexposed portions of bottom resist layer, together with the overlying dielectric layer. The separation between the remaining dielectric on the substrate defines the aligned gate opening.

The resulting substrate is then subjected to heating to alloy the metal and form ohmic contacts on the substrate surface.

Thereafter, the gate is deposited, and metal interconnections are provided on the silica imprinted film, to the drain and source.

Self-aligned ohmic HEMTs with transconductance 330 ms/mm have been obtained at room temperature. The average output conductance is 9 ms/mm and the subthreshold $n_g$ factor is 1.4. This value is much lower than that of an ion-implanted HEMT or MESFET, $n_g=2$.

These and other objects and features of the invention will be apparent from the following detailed description taken in conjunction with the accompanying drawing.

DESCRIPTION OF THE PREFERRED EMBODIMENT

Figure 1A:
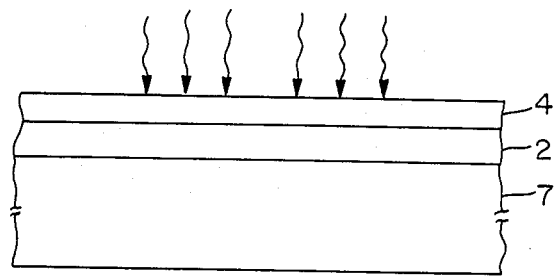
FIGS. 1A to 1F illustrates the steps of the invention for producing a high electron mobility transistor or metal semiconductor field effect transistor.
Figure 1B:
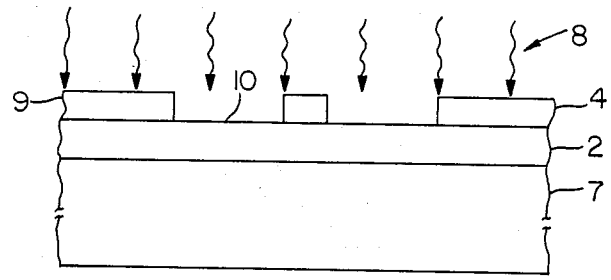
Figure 1C:
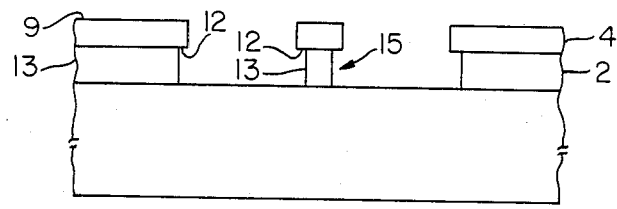
Figure 1D:
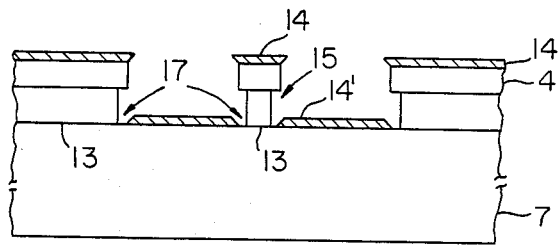
Figure 1E:
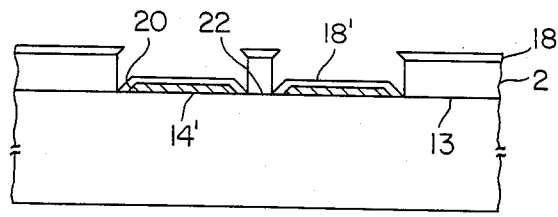
Figure 1F:
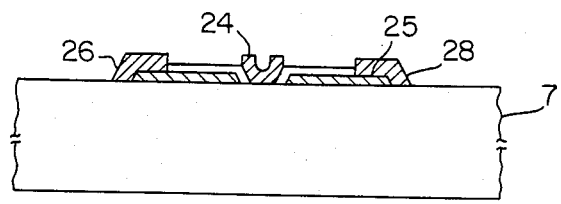

As illustrated at step 1A of the drawing, a bilevel photoresist system is first formed. Two layers of photoresist, consisting of a bottom layer 2 of polymethylmethacrylate (PMMA) and a top layer 4 of regular photoresist (PR) are spun sequentially on a semiconductor substrate 7 suitable for a MESFET (such as GaAs) or for a HEMT (such as GaAs/GaAlAs).

After the bottom PMMA layer is formed on the wafer the PMMA is baked at 150°-190° C. for 35 minutes, and the top layer is then spun up and baked at 90° C. for 35 minutes. The top layer 4 is a positive photoresist such as AZ 1400, marketed by Shipley, or Kodak 820, marketed by Eastman Kodak Co.

In order to form a T-bar dummy gate, as illustrated in step 1B of the drawing, the top photoresist layer 4 is exposed under a pattern to regular UV (436-nm) exposure, and subjected to treatment with photoresist developer such as the material marketed as AZ351 by Shipley Co. to remove the exposed portions of top layer 4 and form a pattern 8 comprised of the unexposed portions 9 of top layer 4, positioned on the bottom layer 2.

The resulting portions of bottom PMMA layer 2 beneath the removed portions of top layer 4 are then exposed and undercut by exposure with deep UV (220-nm) flood exposure, scattering of light beneath the outer edges of the remaining top layer portions 9 of the pattern at 8, and overexposure. Treatment with a chlorobenzene developer attacks and removes the exposed areas 10 of the bottom layer, and also the exposed undercut portions of the bottom layer beneath the adjacent edges of remaining portions 9 of the top resist layer, forming the undercuts at 12, shown in step 1C. The undercutting of the PMMA bottom layer is substantially proportional to the exposure dose of the deep UV light. This procedure now forms the dual level PR/PMMA pattern illustrated in step C, comprised of the remaining undercut unexposed portions 13 of the bottom PMMA layer 2 and the overlying unexposed portions 9 of top photoresist layer 4. The central portion 15 of the dual level pattern formed represents the dummy gate. Using this T-bar dummy gate as a mask, the metals for the source and the drain are deposited, as described below.

As illustrated in step 1D, metal at 14 is then deposited on the upper surface of the remaining portions 9 of the top photoresist layer 4, including the dummy gate 15, and is also deposited at 14' on the exposed upper surface portions of the substrate 7 to form a source and a drain. It is noted that a space 17 is provided between the outer edges of metal layer 14' and the adjacent PMMA resist portions 13 due to the undercutting at 12. The metal is preferably comprised of a first layer of gold, germanium eutectic alloy and a second layer of nickel over the first layer.

The metal at 14 is then lifted off in a first lift-off step, together with the remaining portions 9 of top photoresist layer 4, by soaking in a solvent comprised of methanol, which attacks and removed only the portions 9 of the top photoresist, with the portions 13 of the PMMA photoresist bottom layer 2 remaining on the substrate 7. The metal layer 14' which is deposited on the surface of the substrate 6 remains.

As shown in step 1E, an inorganic dielectric film 18 such as SiO is deposited by vapor deposition over the patterned surface formed by the remaining portions 13 of the bottom PMMA photoresist layer 2, and also at 18' over the layer 14' of metal on the surface of substrate 7. It is seen that the SiO layer 18' also envelops around and covers the outer edges 20 of the metal layer 14'. This occurs because of the space 17 which is provided between the outer edges of the metal layer 14' and the adjacent sides of the bottom photoresist portions 13, by the undercutting at 12.

A second lift-off step is then accomplished by treating the system illustrated in step 1E in a solvent such as acetone to lift off the PMMA bottom resist portions 13, together with the SiO layer 18 thereon, and thereby also removing the dummy gate 15. However, the SiO film 18' overlying the metal layer 14' on the substrate, remains in place. The resulting space 22 formed centrally between the remaining portions of the SiO film or layer 18' on the substrate, forms the self-aligned gate opening on the substrate wafer, of submicron size.

The device is then placed in a high temperature furnace, e.g. at about 500° C., causing the metal layers 14' on the substrate, and beneath the SiO layers 18', and forming the source and the drain to become alloyed and form ohmic contacts.

As illustrated in step 1F, gate metallization can then be carried out by evaporation of successive layers of titanium, platinum and gold, at 24 on the exposed surface of the substrate over the gate opening 22, to form the gate. Portions of the SiO layer 18' are etched away and opened at 25. Metal such as a layer of gold over a layer of titanium, is then deposited in such opened portions of the silica imprinted layer 18', to form interconnections 26 and 28 to the source and drain. The result is the formation of a closed drain-source self-aligned HEMT.

In the finished device, the separation between the source and the gate is very small and is controlled to be the amount of PMMA undercut. In this process, since the photoresist dummy gate is used as the mask for self-aligned ohmic contacts and the real metal gate is put down after the ohmic metal process, the gate recess can be easily provided after the dummy gate is removed.

In summary, a closed drain-source HEMT is thus fabricated according to the invention process, using a dual-level photoresist, double lift-off and dummy gate process. This process uses a photoresist dummy gate to self-align the ohmic contacts. Because a dummy gate is first formed, such dummy gate determines the drain and the source, and consequently a submicron feature is achieved which results in a critical alignment procedure. The resulting structure has very closely spaced source and drain. With conventional alignment procedure it is difficult to define the drain, the source and the gate sufficiently close to each other without interfering with each other.

Comparing conventional HEMTs with self-aligned ohmic HEMTs according to the invention, the self-aligned ohmic HEMT not only has good transconductance, but also has good subthreshold characteristics. Without the necessity for ion implantation and flash annealing, the invention process and technology is more compatible with thin spacer layer and/or superlattice type modulation-doped substrates.

It will be apparent that variations and modifications of the invention procedure can be made to obtain the invention results without departing from the invention. Accordingly, it should be understood that the form of the incention described above is illustrative and is not intended as limitative of the scope of the invention.

What is claimed is:

1. A process for producing a field effect transistor comprising the steps of
   depositing a bottom layer of a first photoresist on said wafer,
   depositing a top layer of a second photoresist on said bottom layer,
   exposing an image of said pattern on said top layer,
   developing said top layer to remove exposed portions thereof,
   exposing the bottom layer beneath the removed portions of said top layer under conditions undercutting the bottom layer beneath the edges of the remaining portions of said top layer,
   developing the bottom layer to remove the exposed portions thereof, and forming T-bar shaped remaining unexposed portions of overlying top and bottom layers,
   depositing metal on the upper surface of said T-bar shaped portions and on the exposed surface of said wafer to form a drain and a source, lifting off the metal on said T-bar shaped portions together with the underlying remaining top layer portions, depositing an inorganic film on the remaining portions of the bottom layer and over the metal on the surface of the wafer, lifting off the inorganic film on the remaining bottom layer portions together with said bottom layer portions, and depositing the gate in the space between remaining portions of the inorganic film on said wafer defining the gate.

2. The process of claim 1, wherein said bottom layer is a polymethylmethacrylate layer and said top layer is a positive photoresist.

3. The process of claim 2, wherein said bottom layer is exposed to deep UV flood exposure, scattering of light beneath the edges of said remaining portions of said top layer to provide said undercutting beneath the edges of said remaining top layer portions.

4. The process of claim 1, wherein a space is left between the outer edges of the metal deposited on the surface of the wafer and the adjacent bottom layer portions of the T-bar shaped portions, defined by the undercut formed beneath the top layer portions of said T-bar shaped portions.

5. The process of claim 4, wherein said inorganic film deposited on the metal on the surface of the wafer envelopes around and covers the outer edges of the metal in the space left between the outer edges of the metal and the adjacent bottom layer portions of the T-bar shaped portions.

6. The process of claim 1, wherein the first lift-off step is carried out in a solvent capable of removing the remaining top layer portions containing the metal, and the second lift-off step is carried out in a solvent capable of removing the remaining bottom layer portions containing the inorganic film.

7. The process of claim 1, said metal comprising a first layer of gold, germanium eutectic alloy and a second layer of nickel over said first layer.

8. The process of claim 1, said inorganic film being a $SiO_x$ film, where x is 1 or 2.

9. The process of claim 1, including subjecting the metal on the surface of the wafer to elevated temperature sufficient to cause alloying of said metal.

10. A self-aligned process for production of high electron mobility transistors having good transconductance and good subthreshold characteristics, which comprises the steps of:

depositing a bottom layer of a first polymethylmethacrylate photoresist on a high electron mobility GaAs/GaAlAs substrate, depositing a second top layer of positive photoresist on said bottom layer, exposing the top layer under a pattern, developing said top layer to remove exposed portions thereof, exposing the bottom layer beneath the previously exposed portions of the top layer, with deep UV flood exposure, scattering of light beneath the edges of said remaining portions of said top layer to undercut the edges of the remaining portions of said top layer, developing the bottom layer to remove the exposed portions thereof, and forming T-bar shaped remaining unexposed portions of overlying top and bottom layers, one of said T-bar shaped portions forming a T-bar dummy gate, depositing a first metal on the upper surface of said T-bar shaped portions and on the exposed surface of said substrate to form a source and a drain, and leaving a space between the outer edges of the metal deposited on the surface of the substrate and the adjacent bottom layer portions of the T-bar shaped portions, defined by the undercut formed beneath the top layer portions of said T-bar shaped portions, lifting off the metal on said T-bar shaped portions including said T-bar dummy gate, together with the underlying top remaining layer portions by treatment in a solvent for said positive photoresist, depositing a SiO film on the remaining portions of the bottom layer and over the on the surface of the substrate, said film covering the outer edges of the metal in the space left between the outer edges of the metal and the adjacent bottom layer portions of the T-bar shaped portions, lifting off the SiO film on the remaining bottom layer portions together with said bottom layer portions, by treatment in a solvent for said polymethylmethacrylate bottom layer portions, and depositing gate metal on the exposed surface of said substrate in the space between remaining portions of the SiO film to define the gate.

11. The process of claim 10, said first metal comprising a first layer of gold, germanium eutectic alloy and a second layer of nickel over said first layer.

12. The process of claim 11, including subjecting the first metal on the surface of the substrate to elevated temperature sufficient to cause alloying of said metal and form ohmic contacts.

13. The process of claim 12, including depositing metal on the silica imprinted portions on the substrate to form interconnections to said source and drain.

* * * * *